US009136127B2

(12) United States Patent
Ma et al.

(10) Patent No.: US 9,136,127 B2
(45) Date of Patent: Sep. 15, 2015

(54) METHOD OF FABRICATING GOI SILICON WAFER, GOI SILICON WAFER AND GOI DETECTION METHOD (71) Applicants: Peking University Founder Group Co., Ltd., Beijing (CN); Founder Microelectronics International Co., Ltd., Shenzhen (CN)

(72) Inventors: Wanli Ma, Shenzhen (CN); Wenkui Zhao, Shenzhen (CN)

(73) Assignees: PEKING UNIVERSITY FOUNDER GROUP CO., LTD., Beijing (CN); FOUNDER MICROELECTRONICS INTERNATIONAL CO., LTD., Shenzhen (CN)

( * ) Notice: Subject to any disclaimer, the term of this patent is extended or adjusted under 35 U.S.C. 154(b) by 0 days.

(21) Appl. No.: 14/093,158

(22) Filed: Nov. 29, 2013

(65) Prior Publication Data
US 2014/0209906 A1 Jul. 31, 2014

(30) Foreign Application Priority Data

Jan. 25, 2013 (CN) .......................... 2013 1 0028772

(51) Int. Cl.
H01L 29/51 (2006.01)
H01L 21/28 (2006.01)
G01R 31/26 (2014.01)
H01L 21/66 (2006.01)

(52) U.S. Cl.
CPC .......... *H01L 21/28238* (2013.01); *H01L 22/14* (2013.01); *H01L 22/34* (2013.01); *H01L 21/28211* (2013.01)

(58) Field of Classification Search
CPC ... H01L 29/51; H01L 21/28158; G01R 31/26
USPC .............. 257/48, 329, 334, E21.575, E27.06, 257/E29.257; 438/589, 585, 592, 305, 618, 438/745
See application file for complete search history.

(56) References Cited

U.S. PATENT DOCUMENTS

| 5,053,105 | A  | * | 10/1991 | Fox, III .......................... 216/40 |
| 6,524,938 | B1 | * | 2/2003 | Tao et al. ........................ 438/585 |
| 6,747,471 | B1 | * | 6/2004 | Chen et al. ............... 324/750.05 |
| 7,396,693 | B2 | * | 7/2008 | Zhao et al. ....................... 438/14 |
| 2004/0173844 | A1 | * | 9/2004 | Williams et al. .............. 257/329 |
| 2010/0155837 | A1 | * | 6/2010 | Hebert ........................... 257/334 |

* cited by examiner

*Primary Examiner* — Sheng Zhu
(74) *Attorney, Agent, or Firm* — Workman Nydegger (57) ABSTRACT The invention discloses a method of fabricating a GOI silicon wafer, a GOI silicon wafer, and a method of GOI detection on the fabricated GOI silicon wafer, where the method of fabricating a GOI silicon wafer includes: in a process of fabricating a trench-type VDMOS, after a trench is formed and a gate oxide layer is grown, a poly-silicon layer is grown; and after the poly-silicon layer is grown, a mask of a metal layer is aligned with a silicon substrate with the poly-silicon layer grown, where the mask of the metal layer is a mask used in formation of the metal layer in the process of fabricating the VDMOS; and at least one pattern for GOI detection is formed on the silicon substrate with the poly-silicon layer grown, through the aligned mask of the metal layer in a photo-lithography to form a GOI silicon wafer. With the technical solution here according to an embodiment of the invention, an error between the GOI silicon wafer and the VDMOS device can be lowered, good accuracy can be achieved, and a resource can be saved effectively, and furthermore the accuracy in a result of GOI detection can be well improved.

10 Claims, 6 Drawing Sheets

METHOD OF FABRICATING GOI SILICON WAFER, GOI SILICON WAFER AND GOI DETECTION METHOD

CROSS REFERENCE TO RELATED APPLICATIONS

The present application claims priority to Chinese Application 201310028772.1 entitled METHOD OF FABRICATING GOI SILICON WAFER, GOI SILICON WAFER AND GOI DETECTION METHOD, filed Jan. 25, 2013, which is incorporated herein by reference.

FIELD OF THE INVENTION

The present invention relates to the field of semiconductor chip process technologies and particularly to a method of fabricating a Gate Oxide Integrity (GOI) silicon wafer in a process of fabricating a trench-type Vertical Double-diffused Metal Oxide Semiconductor transistor (VDMOS), a GOI silicon wafer and a method of GOI detection on a fabricated GOI silicon wafer.

BACKGROUND OF THE INVENTION

Various new types of power devices have emerged along with the development of very large-scale integrated circuits, where the most representative device is a trench-type Vertical Double-diffused Metal Oxide Semiconductor transistor (VDMOS). The VDMOS transistor is an ideal power device in both a switch application and a linear application. Consequently the VDMOS transistor has been widely applied in various fields, e.g., an electronic speed-adjuster, an inverter, a switch power source, an electronic power, a high-fidelity audio system, an electronic ballast, etc. GOI detection is an important step of evaluating the quality of a formed gate oxide layer in a VDMOS fabrication process.

In the prior art, GOI detection on the VDMOS is typically performed by fabricating a GOI silicon wafer and then performing GOI detection on the fabricated GOI silicon wafer. Particularly the GOI silicon wafer needs to be fabricated by growing a gate oxide layer separately on a silicon substrate and then growing a poly-silicon layer on the surface of the grown gate oxide layer to thereby form the GOI silicon wafer. Voltage is applied respectively across the poly-silicon layer and the silicon substrate through the formed GOI silicon wafer to perform a GOI test, and the quality of the gate oxide layer is evaluated from the breakthrough voltage of the resulting oxide layer. In order to ensure test data to be closer to a real condition of the VDMOS device, some patterns may be designed for fabrication of the GOI silicon wafer so that the designed patterns are etched on the silicon substrate through masks and then the gate oxide layer and the poly-silicon layer are grown in that order. In a particular implementation, the different patterns formed on the silicon substrate need the different masks corresponding thereto, and these masks can be referred to as GOI masks, and then corresponding pattern structures are fabricated on the silicon substrate.

In the prior art, a large number of masks have to be fabricated for fabrication of the GOI silicon wafer and consequently have some resource wasted, and required repeated alignment of the different masks may incur a considerable error between the fabricated GOI silicon wafer and the VDMOS device and hence lower the accuracy in a result of detecting the GOI silicon wafer.

SUMMARY OF THE INVENTION

Embodiments of the invention provide a method of fabricating a GOI silicon wafer in a process of fabricating a trench-type Vertical Double-diffused Metal Oxide Semiconductor transistor (VDMOS), and a GOI silicon wafer, which can lower an error between the GOI silicon wafer and the VDMOS device, have good accuracy and can save a resource effectively.

Correspondingly an embodiment of the invention here further provides a method of GOI detection on a fabricated GOI silicon wafer, which can well improve the accuracy in a result of GOI detection.

A method of fabricating a Gate Oxide Integrity (GOI) silicon wafer in a process of fabricating a trench-type Vertical Double-diffused Metal Oxide Semiconductor transistor (VDMOS), an initial oxide layer being grown on a silicon substrate, a trench being formed using the grown initial oxide layer as a mask, and a gate oxide layer being grown on the silicon substrate with the trench formed, wherein the method includes: growing a poly-silicon layer on the silicon substrate with the trench formed and the gate oxide layer grown; after the poly-silicon layer is grown, aligning a mask of a metal layer with the silicon substrate with the poly-silicon layer grown, wherein the mask of the metal layer is a mask used in formation of the metal layer in the process of the fabricating the VDMOS; and forming at least one pattern for GOI detection, on the silicon substrate with the poly-silicon layer grown, through the aligned mask of the metal layer in a photo-lithography to form a GOI silicon wafer.

A Gate Oxide Integrity (GOI) silicon wafer includes: a silicon substrate; a trench formed in a photo-lithography process using an initial oxide layer grown on the silicon substrate as a mask; a gate oxide layer grown on the silicon substrate with the trench formed; a poly-silicon layer grown on the gate oxide layer; and a GOI test pattern formed on the grown poly-silicon layer in a photo-lithography process, wherein the GOI test pattern is consistent with a pattern of a mask of a metal layer, and the mask of a metal layer is a mask used in formation of the metal layer in a process of fabricating a trench-type Vertical Double-diffused Metal Oxide Semiconductor transistor (VDMOS).

A method of GOI detection based upon the GOI silicon wafer includes: determining for any pattern for GOI detection on the GOI silicon wafer the area of the gate oxide layer grown in the pattern to be tested; applying voltage across the poly-silicon layer and the silicon substrate of the GOI silicon wafer; and performing GOI detection according to the value of the applied voltage and the determined area.

With the foregoing technical solutions, in a process of fabricating a trench-type VDMOS, after a trench is formed and a gate oxide layer is grown, a poly-silicon layer is formed, a mask of a metal layer is aligned with a silicon substrate with the poly-silicon layer grown, and at least one pattern for GOI detection is formed, on the silicon substrate with the poly-silicon layer grown, through the aligned mask of the metal layer in a photo-lithography process to form a GOI silicon wafer, so that in the process of fabricating the trench-type VDMOS, the GOI silicon wafer is formed in the photo-lithography process performed on the poly-silicon layer using the mask of the metal layer instead of a mask of the poly-silicon layer, and the mask does not need to be fabricated again, thereby well lowering the number of masks, saving a resource and well lowering the production cost of a manufacturer; and the lowered number of masks can render repeated alignment obviated throughout the fabrication process to thereby well lower an error between the GOI silicon wafer and the VDMOS device, and the fabricated GOI silicon wafer can truly reflect the quality of the gate oxide layer of the VDMOS device to thereby improve the accuracy in a result of detecting the GOI silicon wafer.

DETAILED DESCRIPTION OF THE EMBODIMENTS

In view of the problems in the prior art that a large number of masks have to be fabricated for fabrication of a GOI silicon wafer and consequently have some resource wasted and that required repeated alignment of the different masks may incur a considerable error between the fabricated GOI silicon wafer and a VDMOS device and hence lower the accuracy in a result of detecting the GOI silicon wafer, with a technical solution according to embodiments of the invention, in a process of fabricating a trench-type VDMOS, a poly-silicon layer is formed, and then a GOI silicon wafer is formed in a photo-lithography process using a mask of a metal layer instead of a mask of the poly-silicon layer, thereby well lowering the number of masks, saving a resource, well lowering the production cost of a manufacturer and improving the productivity, and the lowered number of masks can render repeated alignment obviated throughout the fabrication process to thereby well lower an error between the GOI silicon wafer and the VDMOS device, and the fabricated GOI silicon wafer can truly reflect the quality of the gate oxide layer of the VDMOS device to thereby improve the accuracy in a result of detecting the GOI silicon wafer.

A general implementation principle and particular implementations thereof of the technical solution according to the embodiments of the invention and their corresponding attainable advantageous effects will be set forth below in details with reference to the drawings.

Figure 1:
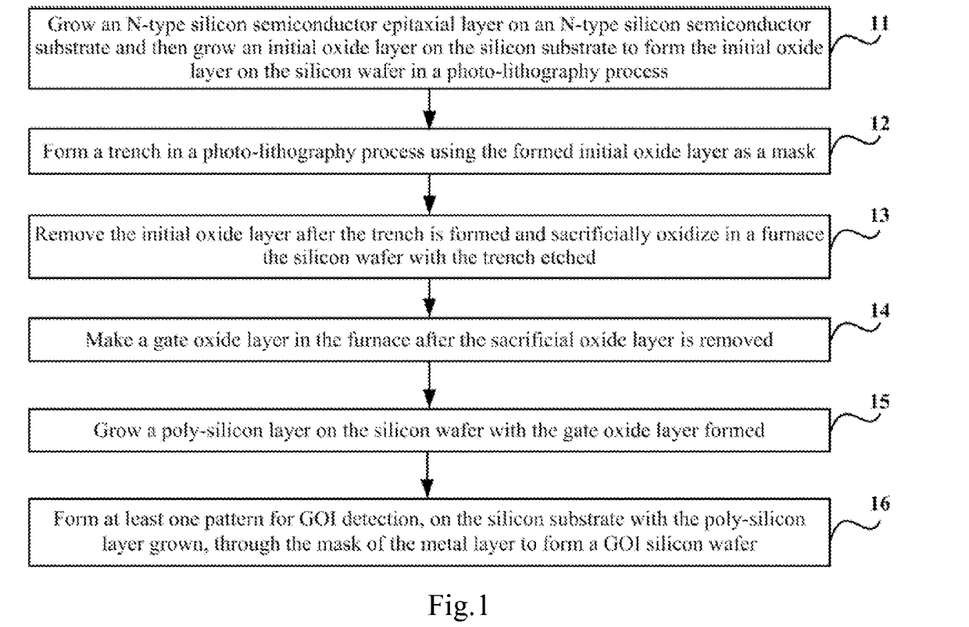
FIG. 1 is a flow chart of a method of fabricating a GOI silicon wafer according to an embodiment of the invention.

An embodiment of the invention here proposes a method of fabricating a GOI silicon wafer, and as illustrated in FIG. 1, a fabrication process of the method is as follows:

The step 11 is to grow an N-type silicon semiconductor epitaxial layer 102 on an N-type silicon semiconductor substrate 101 (also referred to a silicon substrate or a silicon wafer) and then grow an initial oxide layer on the silicon substrate (also referred to the silicon wafer) to form the initial oxide layer 103 on the silicon wafer in a photo-lithography process, as in a process of fabricating a trench-type VDMOS.

Where the initial oxide layer 103 is of silicon dioxide, and the thickness of the initial oxide layer 103 can range from 0.1 to 1.0 μm.

Figure 2:
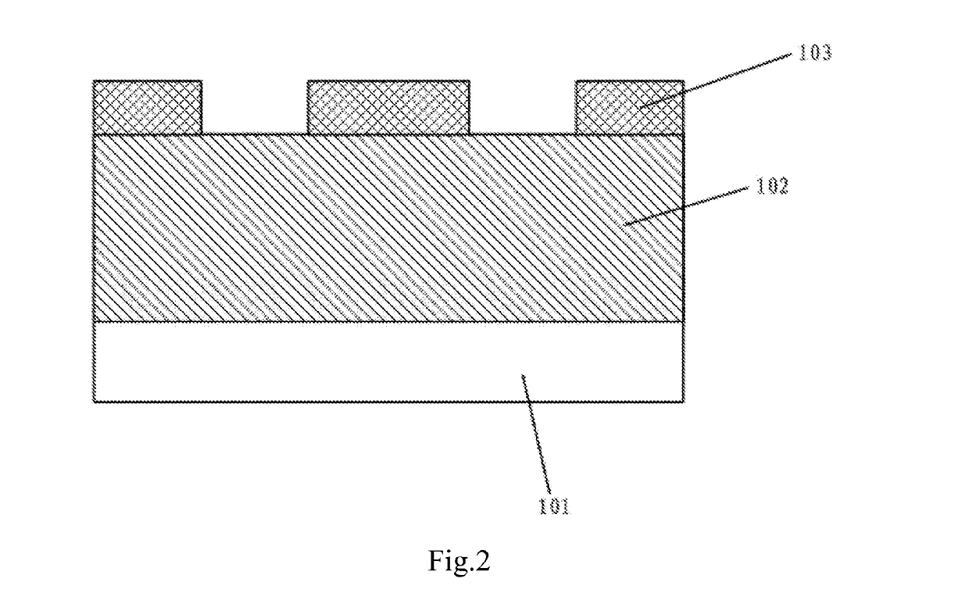
FIG. 2 is a sectional view of the silicon wafer with an initial oxide layer formed according to the embodiment of the invention.

Particularly the initial oxide layer 103 is grown by putting the silicon wafer into a high-temperature furnace for heating to have silicon dioxide of a specific thickness grown on the surface thereof as the grown initial oxide layer 103, and as illustrated in FIG. 2, the initial oxide layer 103 is formed on the silicon wafer in the photo-lithography process.

Where the initial oxide layer may be grown through wet oxide growing or dry oxide growing without any limitation thereto, particularly dependent upon the precision required of the trench-type VDMOS. Preferably wet oxide growing is adopted in the technical solution according to the embodiment of the invention.

Figure 3:
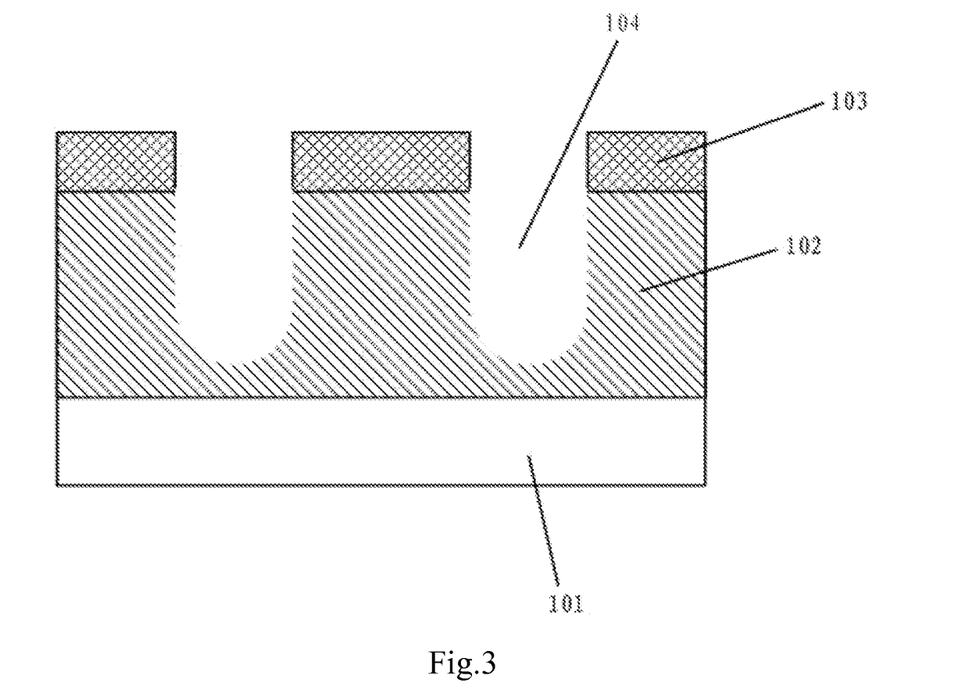
FIG. 3 is a sectional view of the silicon wafer with a trench formed according to the embodiment of the invention.

The step 12 is to form a trench 104 in a photo-lithography process using the formed initial oxide layer 103 as a mask.

Where the grown initial oxide layer 103 and the silicon wafer constitute a base of the trench-type VDMOS. After the initial oxide layer 103 is grown, trench 104 photo-lithography is performed on the grown initial oxide layer 103, the initial oxide layer is etched using a dry etching machine, and trench etching is performed using the initial oxide layer as a mask to form the trench 104. FIG. 3 illustrates a schematic structural diagram of the etched trench.

The step 13 is to remove the initial oxide layer 103 after the trench 104 is formed and to sacrificially oxidize in a furnace the silicon wafer with the trench 104 etched.

Figure 4:
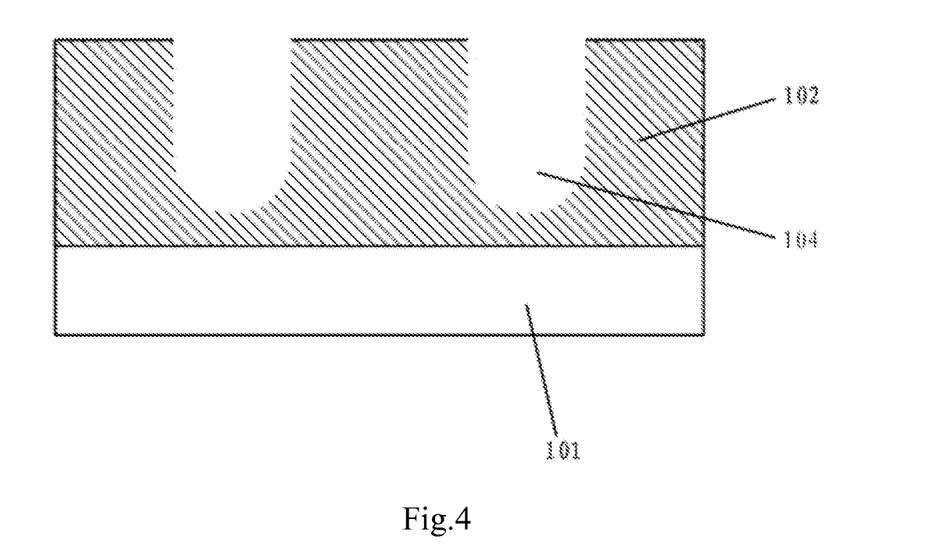
FIG. 4 is a sectional view of the silicon wafer with a sacrificial oxide layer removed according to the embodiment of the invention.

Since impurities may be present on the surface of the etched trench, the impurities on the surface thereof can be removed by putting it into the furnace for high-temperature treatment, i.e., sacrificial oxidation. Particularly after the trench is formed, the initial oxide layer can be eroded away by hydrofluoric acid, and after the initial oxide layer is eroded away, a sacrificial oxide layer is further grown, and then the sacrificial oxide layer is removed by erosive solution, and the depth D of the trench thus formed ranges from 1.0 to 2.0 μm. FIG. 4 illustrates a sectional view of the trench with the sacrificial oxide layer removed.

The step 14 is to make a gate oxide layer 105 in the furnace after the sacrificial oxide layer is removed.

Where the gate oxide layer 105 can be grown through dry oxidation at a thickness ranging from 0.05 to 0.20 μm.

Figure 5:
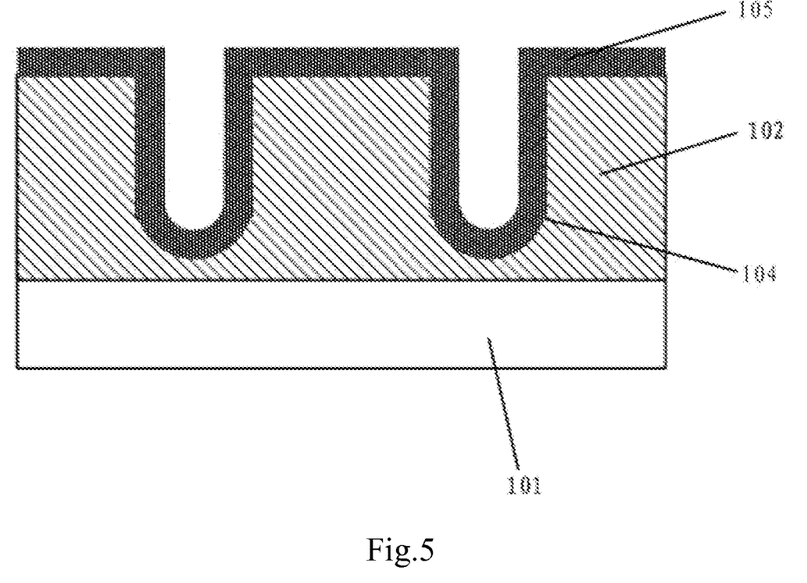
FIG. 5 is a sectional view of the silicon wafer with a gate oxide layer grown according to the embodiment of the invention.
Figure 6:
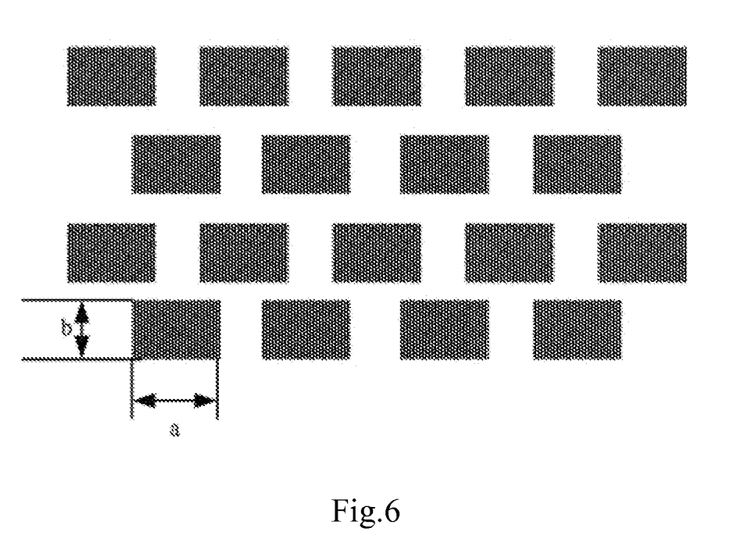
FIG. 6 is a top view of the silicon wafer with the gate oxide layer grown according to the embodiment of the invention.

Particularly as illustrated in FIG. 5, the gate oxide layer 105 with a thickness ranging from 0.05 to 0.20 μm is grown on the clean surface of the epitaxial layer through dry oxidation, and the material of the gate oxide layer 105 can be silicon dioxide ($SiO_2$).

Where GOI detection needs determination of the total area of the gate oxide layer in a test pattern. Particularly FIG. 6 illustrates a top view of the silicon wafer with the gate oxide layer 105 grown, where in the trench-type VDMOS device, the lowest operating element is an elementary cell, and a VDMOS device is composed of multiple such elementary cells. In view of this, the area of the gate oxide layer in a specific pattern can be determined from the length and the width of an elementary cell, the depth of the trench, and the number of elementary cells in the specific pattern. Particularly a mask of the gate oxide layer is designed with the number of elementary cells, and the length and the width of an elementary cell already specified, so the area of the gate oxide layer in each pattern to be tested can be determined for subsequent GOI detection in the formula of:

$$S = 2 \times (a+b) \times D \times N + a \times b \times N,$$

Where S is the area of the gate oxide layer grown in the pattern to be tested, D is the depth of the trench of the trench-type VDMOS, N is the total number of elementary cells in the pattern to be tested, a is the length of an elementary cell in the pattern to be tested, and b is the width of an elementary cell in the pattern to be tested.

The step 15 is to grow a poly-silicon layer 106 on the silicon wafer (also referred to as the silicon substrate) with the gate oxide layer formed.

Figure 7:
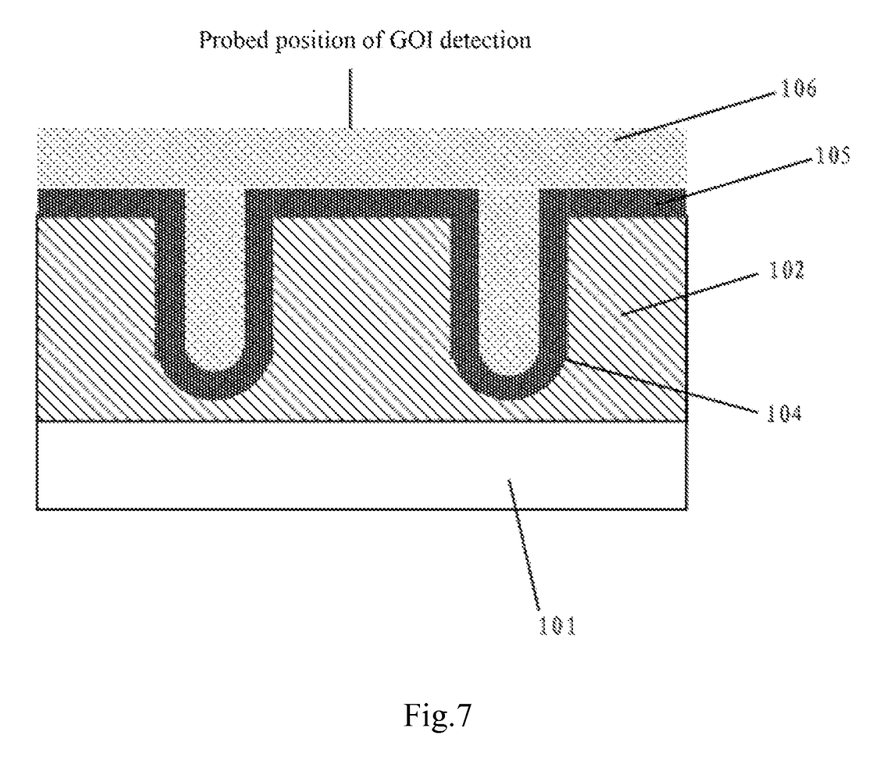
FIG. 7 is a sectional view of the silicon wafer with a poly-silicon layer grown according to the embodiment of the invention.

Particularly the poly-silicon layer 106 has a thickness ranging from 0.5 to 2.0 μm and is grown at temperature of approximately 600° C. Preferably the silicon wafer with the gate oxide layer formed can be put in the furnace at temperate of 625° C. to have a poly-silicon (POLY) layer grown at a thickness of 0.5 to 2.0 μm, and this poly-silicon layer is a gate for fabrication of the trench-type VDMOS device. FIG. 7 illustrates a sectional view of the silicon wafer thus formed.

After the poly-silicon layer 106 is formed, the step 16 is to align a mask of a metal layer with the silicon substrate with the poly-silicon layer grown and to form at least one pattern for GOI detection, on the silicon substrate with the poly-silicon layer grown, through the aligned mask of the metal layer in a photo-lithography process to form a GOI silicon wafer.

Particularly the mask of the metal layer is a mask used in formation of the metal layer in the process of fabricating the VDMOS. The mask of the metal layer used to grow the metal layer in the process of fabricating the VDMOS is designed with the number of elementary cells, and the shape and the size of an elementary cell already preset, so the area of the pattern on the metal layer can be calculated from the number and the size and shape of elementary cells on the mask of the metal layer, and thus a GOI silicon wafer can be fabricated using the mask of the metal layer, particularly as illustrated in FIG. 6.

Figure 8:
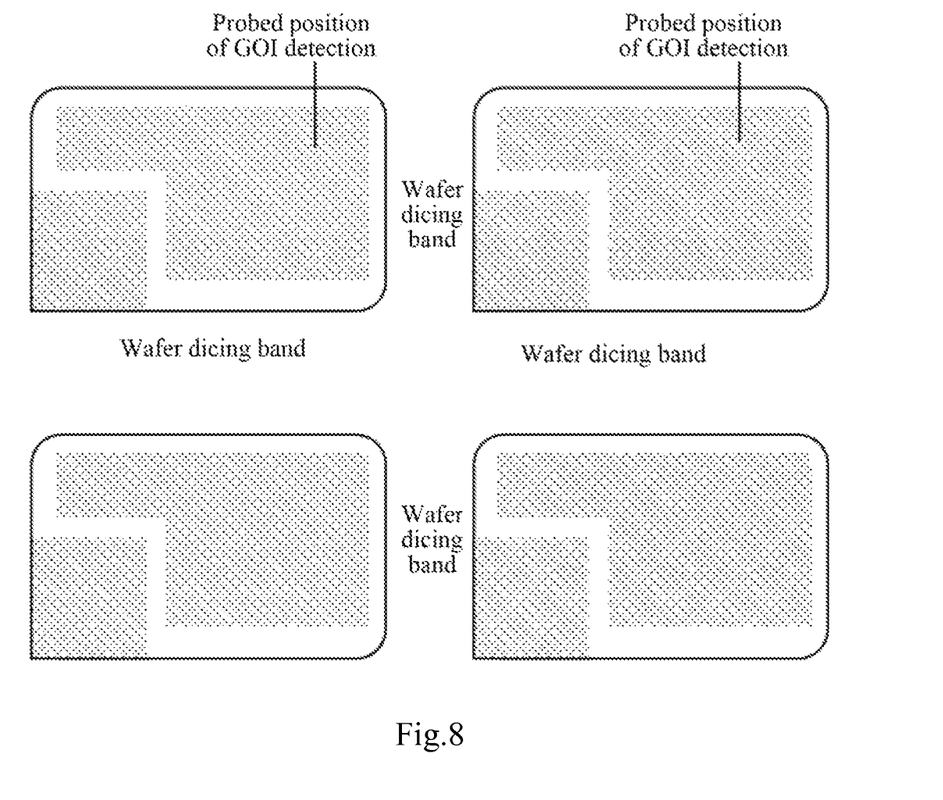
FIG. 8 is a top view of the GOI silicon wafer according to the embodiment of the invention.

With etching using the mask of the metal layer, the poly-silicon layer grown on the surface of the silicon wafer can be etched into at least one separate pattern for GOI detection, where each pattern can be used for GOI detection. FIG. 8 is a top view of the formed GOI silicon wafer, where a GOI probed position in FIG. 8 is a pattern for a GOI test, and in the region of the pattern, the area of the pattern to be tested can be determined in the foregoing formula, particularly as illustrated in FIG. 6.

With the foregoing method of fabricating a GOI silicon wafer, no dedicated GOI mask needs to be additionally fabricated, but instead only the existing mask for fabrication of the trench and the metal layer in the trench-type VDMOS. Moreover the entire process flow of fabricating the GOI silicon wafer does not need to be additionally designed, but instead the flow of fabricating the trench-type VDMOS is directly adopted. When trench-type VDMOSs are fabricated in batch, in the photo-lithography process on the ploy-silicon layer, some silicon wafers can be picked and processed in the photo-lithography process using the mask of the metal layer to form GOI silicon wafers. Thus the number of masks in use can be well lowered, a resource can be saved, and further the production cost of a manufacturer can be lowered; and since the process of fabricating the GOI silicon wafer according to the embodiment of the invention is totally the same as the first section of the flow of fabricating the trench-type VDMOS device, the GOI silicon wafer can truly reflect the quality of the gate oxide layer of the trench-type VDMOS device. Preferably with the foregoing process flow, as many test patterns as possible can be fabricated concurrently on one GOI silicon wafer, that is, the same number of patterns for GOI detection can be fabricated correspondingly as the number of dies on one silicon wafer of the corresponding trench-type VDMOS device, so a demand for GOI detection can be well satisfied and thus the quality of the gate oxide layer throughout the silicon wafer can be effectively monitored.

Figure 9:
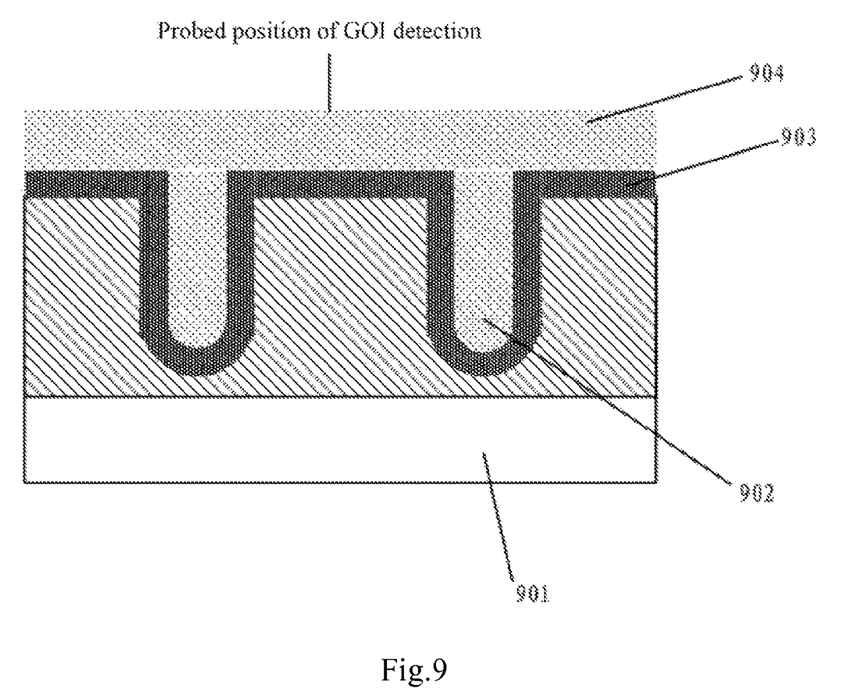
FIG. 9 is a sectional view of the GOI silicon wafer according to the embodiment of the invention.

Correspondingly an embodiment of the invention here further proposes a GOI silicon wafer, as illustrated in FIG. 9, which includes: a silicon substrate 901, a trench 902 formed in a photo-lithography process using an initial oxide layer grown on the silicon substrate as a mask, a gate oxide layer 903 grown on the silicon substrate with the trench formed, a poly-silicon layer 904 grown on the gate oxide layer, and a GOI test pattern formed on the grown poly-silicon layer 904 in a photo-lithography process, where the GOI test pattern is consistent with a pattern of a mask of a metal layer, and the mask of a metal layer is a mask used in formation of the metal layer in a process of fabricating a trench-type VDMOS.

Particularly the thickness of the initial oxide layer of the GOI silicon wafer ranges from 0.1 to 1.0 μm.

Particularly the gate oxide layer of the GOI silicon wafer is an oxide layer, a nitride layer or a layer of a material with a high dielectric constant.

Particularly the depth of the trench of the GOI silicon wafer ranges from 1.0 to 2.0 μm.

Figure 10:
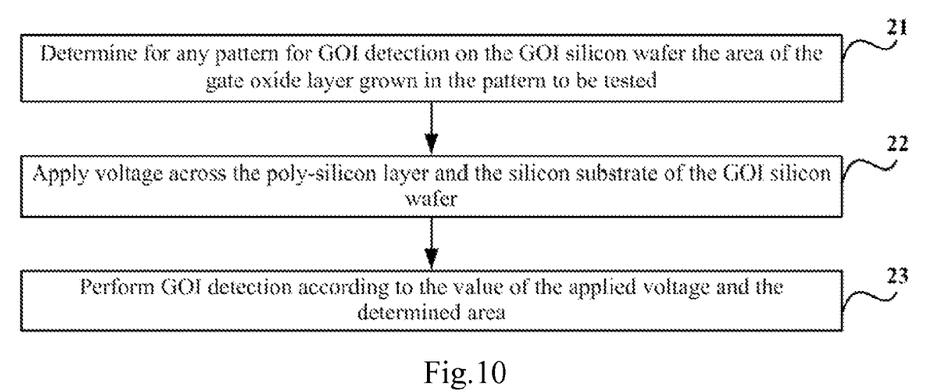
FIG. 10 is a flow chart of a GOI detection method according to an embodiment of the invention.

Correspondingly based upon the GOI silicon wafer above according to the embodiment of the invention, an embodiment of the invention further proposes a GOI detection method, as illustrated in FIG. 10, which includes:

The step 21 is to determine for any pattern for GOI detection on the GOI silicon wafer the area of the gate oxide layer grown in the pattern to be tested.

Where for any pattern for GOI detection, the total number of elementary cells in the pattern to be tested, and the length and the width of an elementary cell in the pattern are determined; the depth of the trench in the trench-type VDMOS is determined; and the area of the gate oxide layer grown in the pattern to be tested is determined from the determined total number, length and width of an elementary cell, and depth of the trench.

Particularly the area of the gate oxide layer grown in the pattern to be tested can be determined from the determined total number, length and width of an elementary cell, and depth of the trench in the formula of:

$$S=2\times(a+b)\times D\times N+a\times b\times N,$$

Where S is the area of the gate oxide layer grown in the pattern to be tested, D is the depth of the trench of the trench-type VDMOS, N is the total number of elementary cells in the pattern to be tested, a is the length of an elementary cell in the pattern to be tested, and b is the width of an elementary cell in the pattern to be tested.

The step 22 is to apply voltage across the poly-silicon layer and the silicon substrate of the GOI silicon wafer.

The step 23 is to perform GOI detection according to the value of the applied voltage and the determined area.

The value of the voltage applied upon breakthrough of the gate oxide layer is determined, and the value of voltage that the gate oxide layer can withstood per unit area is determined from the value of the voltage applied upon breakthrough of the gate oxide layer and the determined area. Thus the quality of the gate oxide layer can be determined from the determined value of voltage that the gate oxide layer can withstand per unit area.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method of fabricating a Gate Oxide Integrity (GOI) silicon wafer in a process of fabricating a trench-type Vertical Double-diffused Metal Oxide Semiconductor transistor (VDMOS), an initial oxide layer being grown on a silicon substrate, a trench being formed using the grown initial oxide layer as a mask, and a gate oxide layer being grown on the silicon substrate with the trench formed, wherein the method comprises:
   growing a poly-silicon layer on the silicon substrate with the trench formed and the gate oxide layer grown;
   aligning a mask of a metal layer with the silicon substrate with the poly-silicon layer grown, wherein the mask of the metal layer is a mask used in formation of the metal layer in the process of the fabricating the VDMOS; and
   forming at least one pattern for GOI detection, on the poly-silicon layer grown on the surface of the silicon wafer, through the aligned mask of the metal layer in a photo-lithography process to form a GOI silicon wafer.

2. The method according to claim 1, wherein the poly-silicon layer has a thickness ranging from 0.5 to 2.0 μm and is grown at temperature of approximately 600° C.

3. A Gate Oxide Integrity (GOI) silicon wafer, the GOI silicon wafer being fabricated by the method according to claim 1, comprising:
   a silicon substrate;
   a trench formed in a photo-lithography process using an initial oxide layer grown on the silicon substrate as a mask;
   a gate oxide layer grown on the silicon substrate with the trench formed;
   a poly-silicon layer grown on the gate oxide layer; and
   a GOI test pattern formed on the grown poly-silicon layer in a photo-lithography process, wherein the GOI test pattern is consistent with a pattern of a mask of a metal layer, and the mask of a metal layer is a mask used in formation of the metal layer in a process of fabricating a trench-type Vertical Double-diffused Metal Oxide Semiconductor transistor (VDMOS).

4. The GOI silicon wafer according to claim 3, wherein the gate oxide layer is an oxide layer, a nitride layer or a layer of a material with a high dielectric constant.

5. The GOI silicon wafer according to claim 3, wherein depth of the trench ranges from 1.0 to 2.0 μm.

6. The GOI silicon wafer according to claim 3, wherein thickness of the initial oxide layer ranges from 0.1 to 1.0 μm.

7. A method of Gate Oxide Integrity (GOI) detection on the GOI silicon wafer according to claim 3, comprising:
   determining, for any pattern for GOI detection on the GOI silicon wafer, an area of the gate oxide layer grown in the pattern to be tested;
   applying voltage across the poly-silicon layer and the silicon substrate of the GOI silicon wafer; and
   performing GOI detection according to a value of the applied voltage and the determined area.

8. The method according to claim 7, wherein determining the area of the gate oxide layer grown in the pattern comprises:
   determining total number of elementary cells in the pattern to be tested, and length and width of an elementary cell in the pattern;
   determining depth of the trench in the trench-type VDMOS; and
   determining the area of the gate oxide layer grown in the pattern to be tested from the determined total number, length and width of an elementary cell, and depth of the trench.

9. The method according to claim 8, wherein the area of the gate oxide layer grown in the pattern to be tested is determined from the determined total number, length and width of an elementary cell, and depth of the trench in a formula of:

$$S = 2 \times (a+b) \times D \times N + a \times b \times N,$$

wherein S is the area of the gate oxide layer grown in the pattern to be tested, D is the depth of the trench of the trench-type VDMOS, N is the total number of elementary cells in the pattern to be tested, a is the length of an elementary cell in the pattern to be tested, and b is the width of an elementary cell in the pattern to be tested.

10. The method according to claim 7, wherein performing GOI detection according to the value of the applied voltage and the determined area comprises:
   determining the value of the voltage applied upon breakthrough of the gate oxide layer; and
   determining the value of voltage that the gate oxide layer can withstood per unit area from the value of the voltage applied upon breakthrough of the gate oxide layer and the determined area.

* * * * *